US007777660B2

(12) United States Patent
Chen et al.

(10) Patent No.: US 7,777,660 B2
(45) Date of Patent: Aug. 17, 2010

(54) MULTI-CHANNEL SAMPLING SYSTEM AND METHOD

(75) Inventors: Ping Chen, Taipei (TW); Shang-Yi Lin, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 100 days.

(21) Appl. No.: 12/206,750

(22) Filed: Sep. 9, 2008

(65) Prior Publication Data

US 2010/0060493 A1 Mar. 11, 2010

(51) Int. Cl.
*H03M 1/12* (2006.01)

(52) U.S. Cl. ....................................... 341/155; 348/572

(58) Field of Classification Search ................. 341/141, 341/155; 348/572, 573

See application file for complete search history.

(56) References Cited

U.S. PATENT DOCUMENTS 5,192,945 A * 3/1993 Kusada ........................ 345/88
6,392,575 B1 * 5/2002 Eklund ........................ 341/141
6,771,203 B1 * 8/2004 Nairn .......................... 341/159
6,900,750 B1 * 5/2005 Nairn .......................... 341/118
7,471,339 B2 * 12/2008 Smith et al. ................. 348/572
2001/0052864 A1 * 12/2001 Shimizu et al. ............. 341/141

FOREIGN PATENT DOCUMENTS

TW 475333 * 2/2002

* cited by examiner

*Primary Examiner*—Howard Williams
(74) *Attorney, Agent, or Firm*—Winston Hsu

(57) ABSTRACT

An apparatus and method for sampling a plurality of digital video signals to generate an interleaved digital video signal is disclosed. The apparatus includes: a first analog-to-digital converter (ADC), coupled to an analog input signal, for converting the analog input signal to a first digital output signal according to a sampling clock signal; a second ADC, coupled to the analog input signal, for converting the analog input signal to a second digital output signal according to the sampling clock signal; a reference clock generator, for generating a reference clock; a random signal generator, for outputting control values in a random sequence; and a clock controller, coupled to the reference clock generator and the random signal generator, for modifying the reference clock signal according to the control values to generate the sampling clock signal to the first ADC and the second ADC.

18 Claims, 4 Drawing Sheets

(A)

(B)

MULTI-CHANNEL SAMPLING SYSTEM AND METHOD

BACKGROUND

The present invention relates to video display, and more particularly, to channel sampling of video signals.

Modern television systems often use digital displays for presenting high definition video data. Digital televisions comprise analog-to-digital converters (ADCs), which receive analog signals and convert them into digital signals for display.

A frame of a digital image is composed of a plurality of pixels, arranged in the form of a matrix. These frames are displayed at high speed to show a moving image. Owing to hardware limitations, the signal conversion cannot be processed fast enough by a single ADC, so a plurality of ADCs are utilized, and the results are interleaved to produce a video frame. The image is also calibrated to ensure gray levels of each pixel match a desired level.

Calibration is complicated, however, and often imperfect. If there is an offset between the two ADCs, this will result in noticeable 'stripes' on an image.

SUMMARY

It is therefore an aim of the present invention to provide a system and method of dual channel sampling that can provide a greater number of sampling sequences that do not have a predetermined order.

A method according to an embodiment of the present invention is disclosed. The method comprises: converting an analog input signal to a first digital output signal according to a sampling clock signal; converting the analog input signal to a second digital output signal according to the sampling clock signal; generating a reference clock; outputting control values in a random sequence; and modifying the reference clock signal according to the control values to generate the sampling clock signal to the analog input signal.

An apparatus according to a first embodiment of the present invention is disclosed. The apparatus comprises: a first analog-to-digital converter (ADC), coupled to an analog input signal, for converting the analog input signal to a first digital output signal according to a sampling clock signal; a second ADC, coupled to the analog input signal, for converting the analog input signal to a second digital output signal according to the sampling clock signal; a reference clock generator, for generating a reference clock; a random signal generator, for outputting control values in a random sequence; and a clock controller, coupled to the reference clock generator and the random signal generator, for modifying the reference clock signal according to the control values to generate the sampling clock signal to the first ADC and the second ADC.

An apparatus according to a second embodiment of the present invention is also disclosed. The apparatus comprises: a first analog-to-digital converter (ADC), coupled to an analog input signal, for converting the analog input signal to a first digital output signal according to a sampling clock signal; a second ADC, coupled to the analog input signal, for converting the analog input signal to a second digital output signal according to the sampling clock signal; a reference clock generator, for generating a reference clock; a random signal generator, for outputting control values in a random sequence; a clock controller, coupled to the reference clock generator and the random signal generator; and a storage device, coupled to the clock controller, for storing a look-up table recording a plurality of reference clock control patterns; wherein the clock controller selectively inverts the reference clock signal according to the control values and the reference clock control patterns to generate the sampling clock signal to the first ADC and the second ADC.

These and other objectives of the present invention will no doubt become obvious to those of ordinary skill in the art after reading the following detailed description of the preferred embodiment that is illustrated in the various figures and drawings.

DETAILED DESCRIPTION

The present invention utilizes a random generation scheme to determine the interleaved sequence of each line of pixels, or each frame of the video signal. As the order of each line or each frame will be random, each frame may have a different sampling order from a previous and subsequent frame, thereby more effectively deceiving the eyes of a user.

Figure 1:
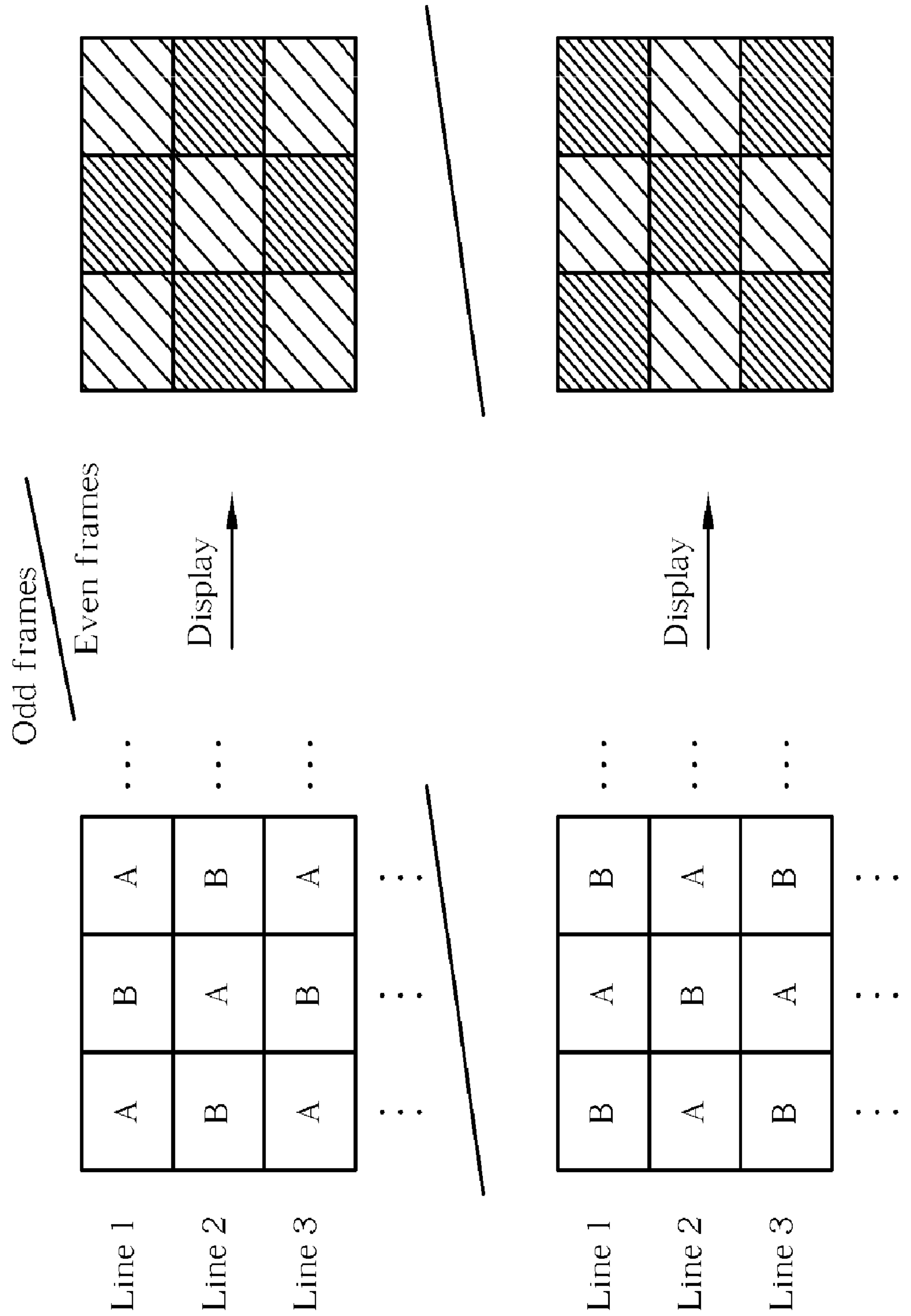
Fig. 1 Related Art
FIG. 1 is a diagram of sampled frames of an image according to the related art.
Figure 2:
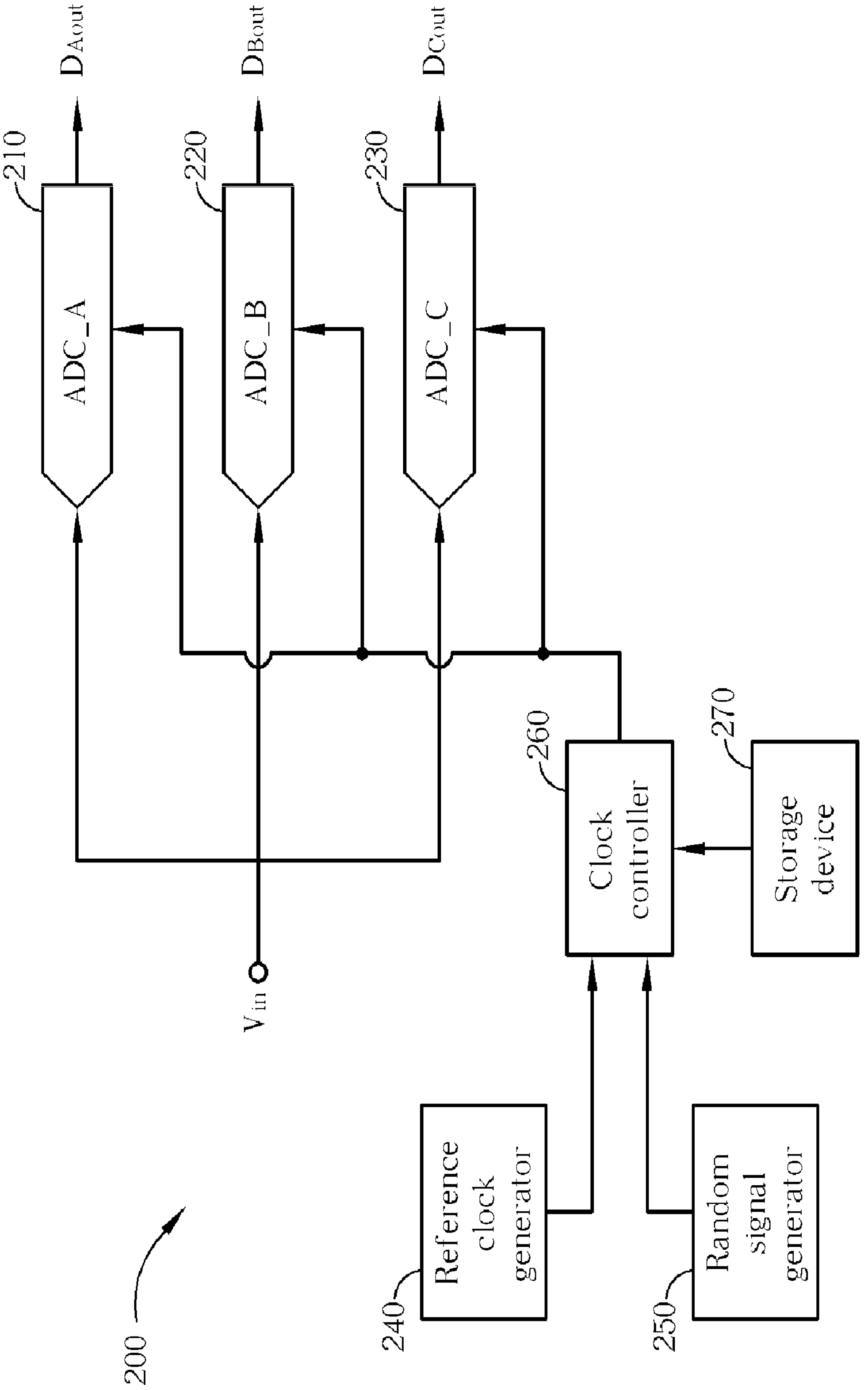
FIG. 2 is a diagram of a dual channel sampling system according to a first embodiment of the present invention.

Please refer to FIG. 2. FIG. 2 is a block diagram of a dual channel sampling system 200 according to an exemplary embodiment of the present invention. The dual channel sampling system 200 comprises a first ADC_A 210, a second ADC_B 220, a third ADC_C 230, a reference clock generator 240, a random signal generator 250, a clock controller 260, and a storage device 270. A voltage $V_{in}$ is input to the first ADC_A 210, the second ADC_B 220, and the third ADC_C 230. A reference clock is generated by the reference clock generator 240 and input to the clock controller 260, which generates a sampling clock and outputs the sampling clock to the first ADC_A 210, the second ADC_B 220, and the third ADC_C 230. The sampling clock is for controlling the selection of the first ADC_A 210, the second ADC_B 220, and the third ADC_C 230, for example, on a peak of the sampling clock 240 the first ADC_A 210 is enabled and on a trough of the sampling clock 240 the second ADC_B 220 is enabled. In this way, the first output $D_{Aout}$ and the second output $D_{Bout}$ are interleaved. Please note that it is also possible to interleave the second ADC_B 220, and the third ADC_C 230, or interleave all three ADCs. This will be easily understood by those skilled in this art.

A method according to a first embodiment of the present invention will now be detailed. In this first embodiment the storage device 270 is not utilized. For simplicity of illustration, the first embodiment will be described with reference to the first ADC_A 210 and the second ADC_B 220 only. Please note that the method can also be applied to a scheme with three or more ADCs. In this embodiment, the random signal generator 250 can generate two control values, logic "0" and logic "1". The values are generated at the beginning of each line of pixels of a frame of a video image. Each randomly generated value is input to the clock controller 260, which then determines whether to invert the reference clock or not according to the received control value. The sampling order of each line of pixels is therefore dynamically determined.

Figure 3:
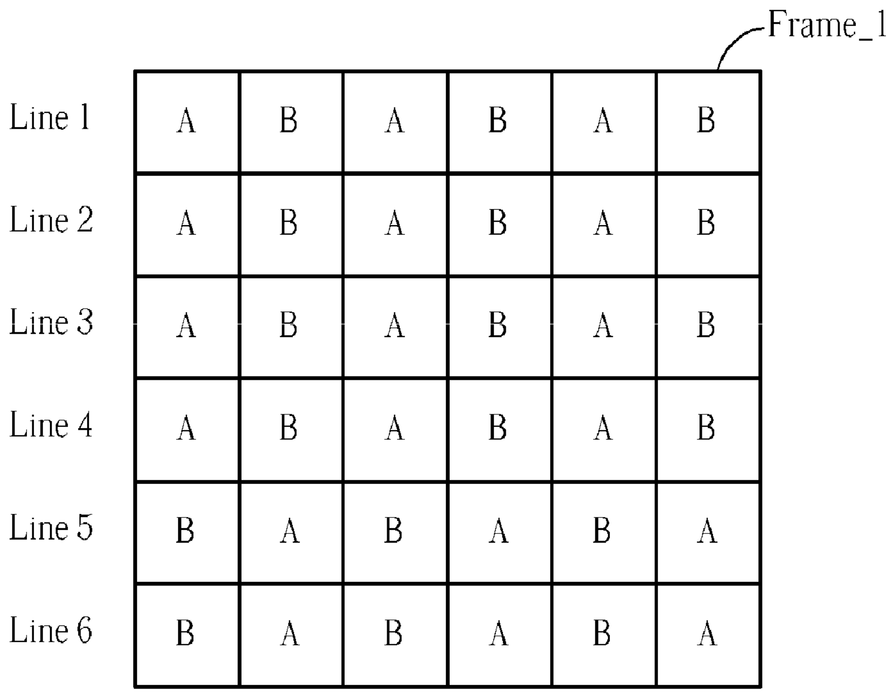
FIG. 3 is a diagram of sampling sequences of two consecutive frames of an interleaved digital video signal.
Figure 3:
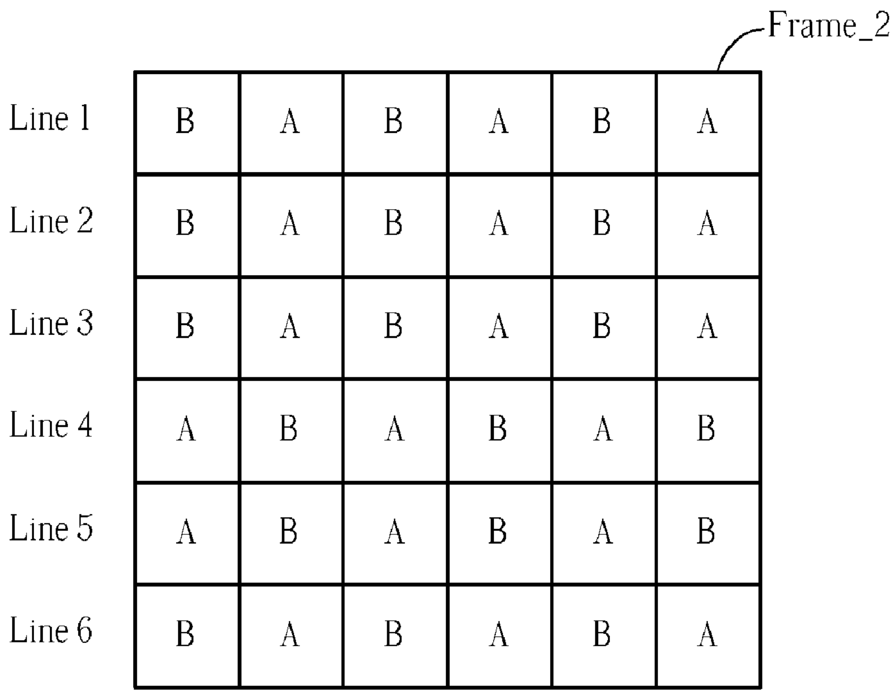

Please refer to FIG. 3. FIG. 3 is a possible interleaved scheme of two consecutive frames of a video signal according to the first embodiment of the present invention. For simplicity of illustration, each video frame is represented as a 6×6 matrix. In 3A, a first line (line 1) of a video frame frame_1 has a sampling order [ABABAB]. In line 2, the random signal generator 250 outputs a control value "0" thereby instructing the logic unit 230 not to invert the reference clock. In lines 3 and 4 the random signal generator 250 similarly outputs a control value "0", so lines 1-4 all have the same sampling sequence. In line 5, the random signal generator 250 outputs a control value "1" thereby instructing the clock controller 260 to invert the reference clock so the second ADC is sampled twice in two consecutive clock periods. The sampling sequence of line 5, therefore, is [BABABA]. In line 6, the random signal generator 250 outputs a control value "0" thereby instructing the clock controller to maintain the reference clock so the sampling sequence of line 6 is the same as that of line 5. In 3B, the random signal generator 250 outputs a control value "0" in lines 1, 2, and 3 of video frame frame_2; a control value "1" in line 4, a control value "0" in line 5, and a control value "1" in line 6. Please note that the two above-described control value generation sequences are merely given as examples of possible sampling sequences and are in no way meant to limit the currently described embodiment.

A method according to a second embodiment of the present invention randomly generates frame sampling sequences according to a plurality of predetermined sequences. The storage device 270 stores a plurality of reference clock sequences corresponding to different frame sampling patterns. The random control values are generated by the random signal generator 250 at the beginning of each frame of the video signal, rather than at the beginning of each line, to inform the clock controller 260 which frame sampling sequence is to be utilized. The clock controller 260 then accesses the storage device 270 to determine which reference clock sequence the random control value corresponds to, and controls the reference clock to generate the sampling clock to sample the first ADC_A 210 and the second ADC_B 220 according to the selected sampling sequence.

This embodiment will be described with reference to two sampling sequences, herein referred to as sequence 1 and sequence 2. Please note that there is no limitation on the number of predetermined reference clock sequences. In sequence 1 each odd line of pixels has a sampling order [ABABAB] and each even line of pixels has a sampling order [BABABA]. In sequence 2 each odd line of pixels has a sampling order [BABABA] and each even line of pixels has a sampling order [ABABAB]. As there are only two predetermined sampling sequences, the random signal generator 250 similarly outputs control values "0" and "1" in a random order, where logic "0" refers to frame 1 and logic "1" refers to frame 2. When the clock controller 260 receives an input of logic "0" from the random signal generator 250 it will access the storage device 270 to determine which reference clock sequence logic "0" corresponds to. The clock controller 260 will then control the reference clock to generate the sampling clock to sample the first ADC_A 210 and the second ADC_B 220 according to sequence 1 for an entire frame. When the clock controller 260 receives a logic "1" input from the random signal generator 250 it will access the storage device 270 to determine which reference clock sequence logic "1" corresponds to. The clock controller 260 will then control the reference clock to generate the sampling clock to sample the first ADC_A 210 and the second ADC_B 220 according to sequence 2 for an entire frame.

As the random control value is only output per frame, rather than per line as in the first embodiment, the multi-channel sampling system can generate frames of predetermined sampling sequence in a random order. This has the same effect of deceiving the eyes of the user, as no repeated pattern of frames will occur.

Figure 4:
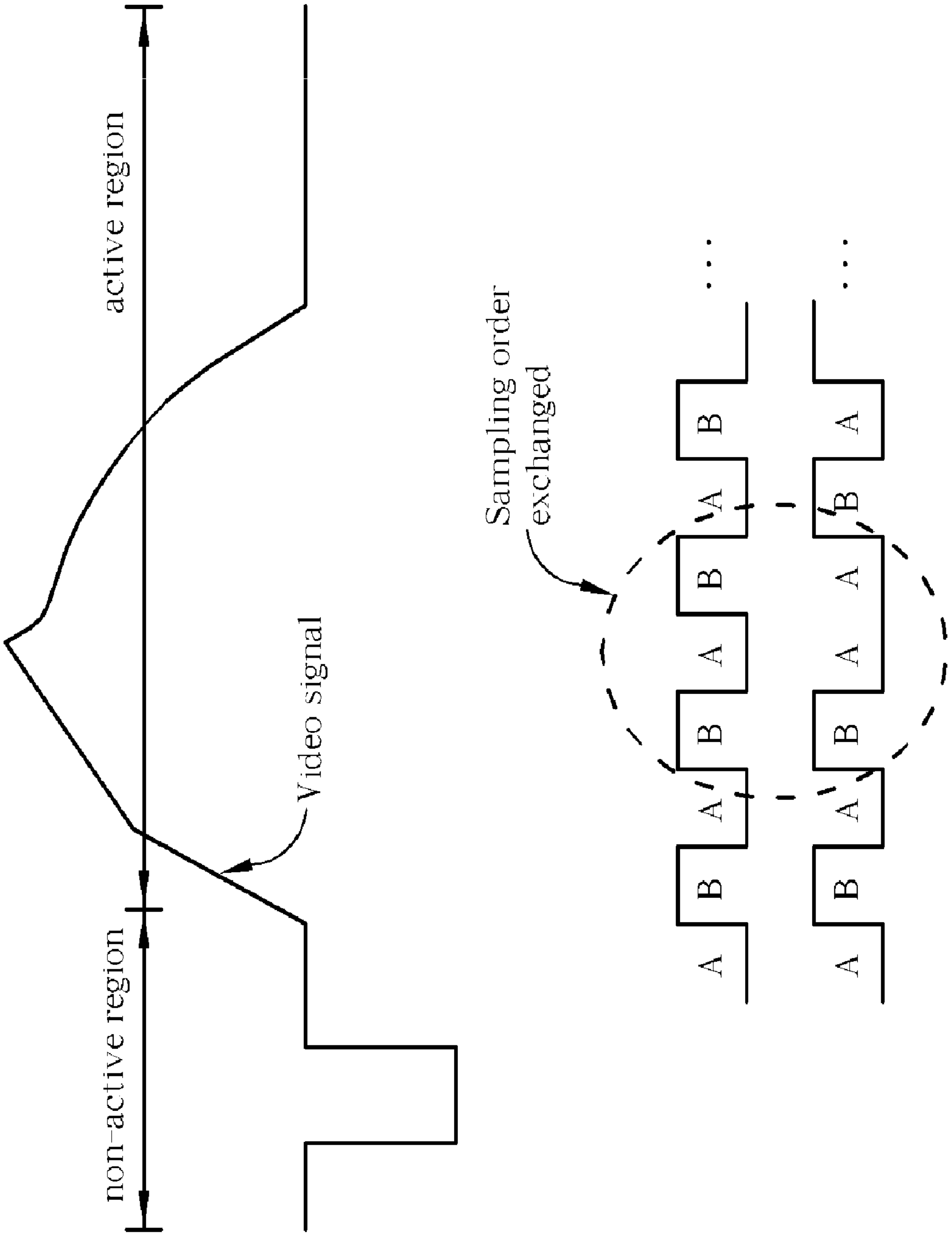
FIG. 4 is a diagram of inverting a sampling sequence of a video signal.

Please refer to FIG. 4. FIG. 4 is a diagram of a video signal showing an active region and a non-active region, wherein the active region corresponds to video data and the non-active region corresponds to a blank interval in the video signal. By exchanging the sampling order of the first ADC_A 210 and the second ADC_B 220 during the non-active region, smooth transition between sampled pixels can be achieved.

When all three ADCs are utilized, the random signal generator 250 can output a binary combination as the control value, where a first binary combination corresponds to interleaving the first ADC_A 210 and the second ADC_B 220, a second binary combination corresponds to interleaving the second ADC_B 220 and the third ADC_C 230, and a third binary combination corresponds to interleaving all three ADCS. Furthermore, in the second embodiment, the storage device 270 can store three (for example) frame sampling sequences, and binary combination 100 could correspond to a first frame sampling sequence, binary combination 110 could correspond to a second sampling sequence, and binary combination 101 could correspond to a third sampling sequence. These modifications all fall within the scope of the present invention.

By utilizing a random order of generated control values to determine an interleaved order of sampled pixels, there will be no detectable interleaving, as there is no repeated interleaved pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-channel sampling system for producing an interleaved digital output signal, comprising:
   - a first analog-to-digital converter (ADC), coupled to an analog input signal, for receiving a sampling clock signal and converting the analog input signal to a first digital output signal according to the sampling clock signal;
   - a second ADC, coupled to the analog input signal, for receiving the sampling clock signal and converting the analog input signal to a second digital output signal according to the sampling clock signal;
   - a reference clock generator, for generating a reference clock signal which defines a first order of enabling the first ADC and the second ADC;
   - a random signal generator, for outputting control values in a random sequence; and
   - a clock controller, coupled to the reference clock generator and the random signal generator, for modifying the reference clock signal according to the control values to generate the sampling clock signal to the first ADC and the second ADC, wherein the sampling clock signal generated by the clock controller defines a second order of enabling the first ADC and the second ADC, and the second order is different from the first order.

2. The multi-channel sampling system of claim 1, wherein the clock controller selectively inverts the reference clock signal according to the control values to generate the sampling clock signal.

3. The multi-channel sampling system of claim 2, wherein the analog input signal is an analog video signal transmitting a plurality of frames, and the random signal generator outputs a control value at the beginning of each line of each frame.

4. The multi-channel sampling system of claim 3, wherein the control value is a binary value "0" or a binary value "1".

5. The multi-channel sampling system of claim 3, further comprising:

a third ADC, coupled to the analog input signal, for converting the analog input signal into a third digital output signal according to the sampling clock signal.

6. The multi-channel sampling system of claim 2, further comprising:

a storage device, coupled to the clock controller, for storing a look-up table recording a plurality of reference clock control patterns;

wherein the clock controller selectively inverts the reference clock signal according to the control values and the reference clock control patterns to generate the sampling clock signal.

7. The multi-channel sampling system of claim 6, wherein the analog input signal is an analog video signal transmitting a plurality of frames, the random signal generator outputs a control value at the beginning of each frame, and the clock controller selects a reference clock control pattern according to the control value and inverts the reference clock signal according to the reference clock control pattern to generate the sampling clock signal.

8. The multi-channel sampling system of claim 7, further comprising:

a third ADC, coupled to the analog input signal, for converting the analog input signal into a third digital output signal according to the sampling clock signal.

9. The multi-channel sampling system of claim 7, wherein the control value is a binary combination, and each binary combination corresponds to a different reference clock control pattern.

10. A method of sampling multiple channels for producing an interleaved digital output signal, comprising:

converting an analog input signal to a first digital output signal according to a sampling clock signal;

converting the analog input signal to a second digital output signal according to the sampling clock signal;

generating a reference clock signal which defines a first order of performing the step of converting the analog input signal to the first digital output signal and the step of converting the analog input signal to the second digital output;

outputting control values in a random sequence; and modifying the reference clock signal according to the control values to generate the sampling clock signal which defines a second order of performing the step of converting the analog input signal to the first digital output signal and the step of converting the analog input signal to the second digital output, wherein the second order is different from the first order.

11. The method of claim 10, wherein the step of modifying the reference clock signal according to the control values to generate the sampling clock signal further comprises:

inverting the reference clock signal according to the control values to generate the sampling clock signal.

12. The method of claim 11, wherein the analog input signal is an analog video signal transmitting a plurality of frames, and the step of outputting control values in a random sequence further comprises:

outputting a control value at the beginning of each line of each frame.

13. The method of claim 12 wherein the control value is a binary value "0" or a binary value "1".

14. The method of claim 12, wherein the step of modifying the reference clock signal according to the control values to generate the sampling clock signal further comprises:

converting the analog input signal into a third digital output signal according to the sampling clock signal.

15. The method of claim 11, wherein the step of inverting the reference clock signal according to the control values to generate the sampling clock signal further comprises:

storing a look-up table recording a plurality of reference clock control patterns; and selectively inverting the reference clock signal according to the control values and the reference clock control patterns to generate the sampling clock signal.

16. The method of claim 15 wherein the analog input signal is an analog video signal transmitting a plurality of frames, and the step of outputting control values in a random sequence further comprises:

outputting a control value at the beginning of each frame;

and the step of selectively inverting the reference clock signal according to the control values and the reference clock control patterns to generate the sampling clock signal further comprises:

selecting a reference clock control pattern according to the control value; and inverting the reference clock signal according to the reference clock control pattern to generate the sampling clock signal.

17. The method of claim 16, wherein the step of modifying the reference clock signal according to the control values to generate the sampling clock signal to the analog input signal further comprises:

converting the analog input signal into a third digital output signal according to the sampling clock signal.

18. The method of claim 16 wherein the control value is a binary combination, and each binary combination corresponds to a different reference clock control pattern.

* * * * *